United States Patent [19]

Axer

[11] Patent Number: 5,394,105

[45] Date of Patent: Feb. 28, 1995

[54] DEVICE FOR CONTACTLESS ENERGY AND DATA TRANSMISSION

[75] Inventor: Klaus Axer, Lübeck, Germany

[73] Assignee: U.S. Philips Corporation, New York, N.Y.

[21] Appl. No.: 40,055

[22] Filed: Mar. 30, 1993

[30] Foreign Application Priority Data

May 26, 1992 [DE] Germany ............................ 4217382

[51] Int. Cl.⁶ ........................... H03L 1/00; H03L 5/00
[52] U.S. Cl. ................................. 327/531; 327/530; 327/510
[58] Field of Search ..................... 307/264, 268, 296.1, 307/493, 490, 491, 494, 497, 359, 572

[56] References Cited

U.S. PATENT DOCUMENTS 4,492,926  1/1985  Kusakabe et al. .................. 307/264
5,039,887  8/1991  Brahms et al. ...................... 307/264

FOREIGN PATENT DOCUMENTS 3242551  5/1983  Germany .

Primary Examiner—William L. Sikes
Assistant Examiner—Fetsum Abraham
Attorney, Agent, or Firm—Bernard Franzblau

[57] ABSTRACT

In integrated storage circuits which receive energy only via a coil in a contactless manner and which also execute the data exchange, the integrated storage circuit loads the coil to a greater extent dependent upon the data read. It is possible to detect this load variation in the device feeding the coil. Detection is more reliable as the load variation is greater. However in the case of a high coil load, the voltage across the coil decreases to such an extent that, after rectification, it is no longer sufficient to reliably energize. The supply voltage for the storage circuit is generated by means of a voltage increase circuit during the increased load. The voltage increase circuit is controlled by the data. If a voltage comparator compares the voltage generated by the voltage increase circuit with a reference voltage and controls the load device in dependence thereon, a control circuit is obtained which maintains a minimum voltage across the coil, and hence at the output of the voltage increase circuit, ever during increased loading of the coil by the load device.

18 Claims, 3 Drawing Sheets

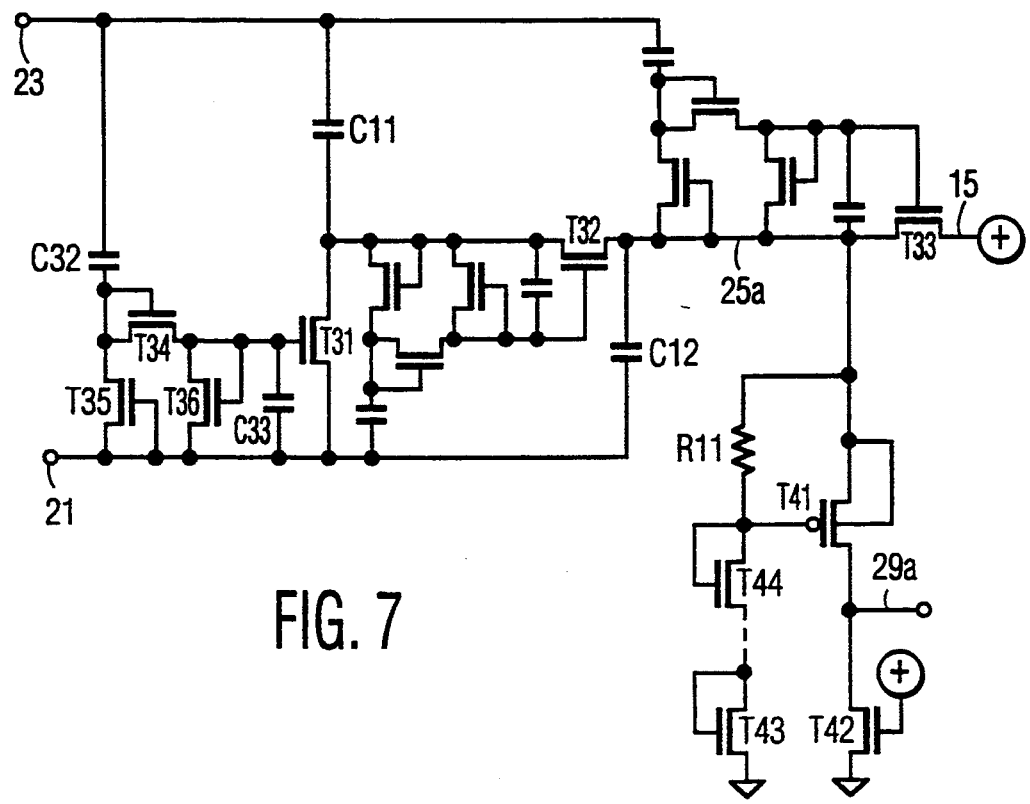
FIG. 7

DEVICE FOR CONTACTLESS ENERGY AND DATA TRANSMISSION

BACKGROUND OF THE INVENTION

This invention relates to a device for contactless energy and data transmission, comprising a storage circuit with an output lead for the output of stored data, a coil for receiving a magnetic alternating field and for generating an alternating voltage, a circuit arrangement for generating a supply voltage for the storage circuit, the circuit arrangement comprising a rectifier circuit which is connected to the coil in order to generate the supply voltage from the alternating voltage, and a load device for generating an increased load of the coil which is dependent on the data to be output.

A device of this kind is known from DE-PS 32 42 551. The variation of the coil load influences the magnetic alternating field transmitted by a read station which cooperates with the storage circuit, and the variation of the magnetic alternating field can be detected in the read station so that the data from the storage circuit can be taken up in a contactless manner by the read station. Control of the storage circuit requires additional logic and control circuits which are combined with the storage circuit. Therefore, storage circuit is understood to mean hereinafter the combination including these additionally required circuits.

The evaluation of the variation of the magnetic alternating field due to the data-dependent load variation is more reliable as the coupling between the coil and the transmission device of the read station is stronger, and also as the load variation by the data is greater. Because the coupling may not be arbitrarily tight for mechanical and practical reasons, an as large as possible load variation should be induced by the data. Because the supply voltage for the storage circuit is derived from the coil, the coil is already loaded to a given extent thereby and because, on the other hand, in the case of excessive loading of the coil the supply voltage generated by the rectifier becomes too small, in the known device the extent of the permissible load variation is limited.

SUMMARY OF THE INVENTION

Therefore, it is an object of the invention to provide a device of the kind set forth which enables a larger variation of the coil load while maintaining an adequate supply voltage.

This object is achieved in accordance with the invention in that, parallel to the rectifier circuit, a voltage increase circuit is connected to the coil, which voltage increase circuit comprises a control input which is connected to the output lead of the storage circuit. The voltage increase circuit serves to generate at a voltage output thereof a direct voltage which is higher relative to the amplitude of the alternating voltage and which serves as a supply voltage for the storage circuit for the duration of the increased load.

For the duration of the increased load, the voltage supply for the storage circuit is thus taken over by the voltage increase circuit so that only a small alternating voltage need be present across the coil in the loaded condition. The voltage increase circuit represents an additional load for the coil but only for the duration of the already increased load, so that this additional load even has a favourable effect.

The extent of the increased load may be permanently adjusted. However, in that case there is the risk that in the case of excessively loose coupling between the transmitter of the read device and the coil, the alternating voltage across the coil becomes so low during the increased load that the voltage increase circuit can no longer generate an adequate supply voltage for the storage circuit. Therefore, an embodiment of the invention is characterized in that a voltage output of the voltage increase circuit is connected to a supply voltage input of the storage circuit via a rectifier device and directly to a voltage comparator circuit which outputs a control signal when the higher direct voltage reaches a predetermined value, the load device increasing the coil load only under the control of this control signal. Thus, the load device is still controlled by the data to be output, albeit no longer directly but by the fact that the voltage increase circuit, being controlled by the data to be output., generates a supply voltage which is adequate for powering the storage circuit. The extent of the variation of the magnetic alternating field to be detected in the read device in order to recover the data is then dependent on the electromagnetic coupling between the coil and the transmitter of the read device, but even in the event of a comparatively loose coupling it is still sufficient because of the use of the voltage increase circuit in accordance with the invention.

A voltage increase circuit can be constructed, for example, using inductive elements through which a periodically switched current flows from the supply voltage of the rectifier circuit. However, in practice it is hardly possible to form inductive elements within an integrated circuit so that a circuit comprising capacitances is more effective. However, because the rectifier circuit generally exhibits a voltage drop of the rectifier voltage relative to the peak amplitude of the alternating voltage, during the increased load only a very small signal voltage is available to such a voltage increase circuit. In order to obtain a higher signal voltage for improved operation, in a further embodiment of the invention the voltage increase circuit comprises a voltage multiplier circuit and a switching device which includes a control input which is connected to the output lead in order to receive the data to be output, two inputs which are connected to the coil, and two switching outputs which are connected to the voltage multiplier circuit and which are coupled to an associated input dependent upon the data received on the control input. A circuit arrangement of this kind is already proposed in the previous, non-prepublished German Patent Application P 41 00 209.1 and offers the advantage that the entire alternating voltage occurring across the coil is available as a signal voltage for the voltage multiplier circuit.

For implementation within an integrated circuit, a voltage multiplier circuit comprising capacitances and rectifiers is most effective. In the case of multistage multiplication, however, several rectifiers are connected in series, their voltage drops being summed so that in the event of a very low input voltage the operation of such a voltage multiplier circuit is uneconomical. Therefore, an embodiment of the invention which comprises at least one voltage multiplier circuit consisting of capacitances and rectifier devices is characterized in that each rectifier device is formed by the main current path of a first field effect transistor whose gate is connected to a bias circuit in order to supply a bias voltage for the gate relative to a terminal of the main current path, thus reducing the effective threshold voltage of the field effect transistor in the turned-on state, the bias circuit comprising capacitances and rectifier devices in the form of further field effect transistors. A circuit arrangement of this kind is already proposed in the previous, non-prepublished document EP-A-513 910 which corresponds approximately to U.S. Pat. No. 5,268,833 (Dec. 7, 1993) and offers the advantage that the individual rectifier devices have only an extremely small voltage drop and that all rectifier elements can be realised as field effect transistors, so that in an integrated circuit, they can be constructed by means of the same process as the other elements for data processing and data storage.

BRIEF DESCRIPTION OF THE DRAWING

Embodiments of the invention will be described in detail hereinafter with reference to the accompanying drawing, in which:

FIG. 6a–6d shows some diagrams illustrating voltage variations in the voltage multiplier circuit, and FIG. 7 shows the implementation of the voltage multiplier circuit of FIG. 5 exclusively by means of field effect transistors.

DESCRIPTION OF THE PREFERRED EMBODIMENTS

Figure 1:
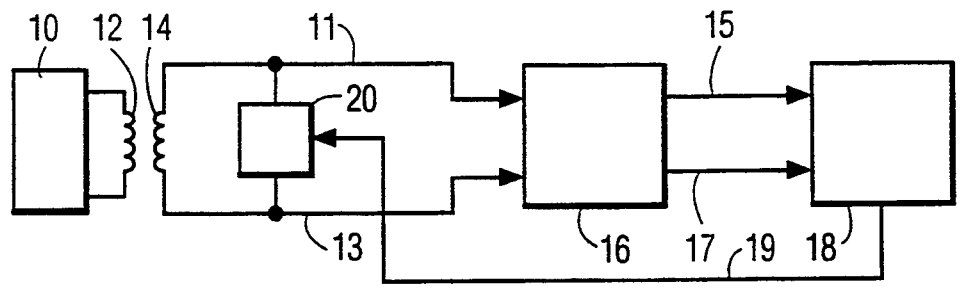
FIG. 1 shows a known device for contactless energy and data transmission.

FIG. 1 shows diagrammatically a read station 10 which comprises a transmitter which feeds a coil 12. The magnetic alternating field generated by this coil is picked up by a coil 14 which thus generates an alternating voltage on the leads 11 and 13, which alternating voltage is applied to a load device 20 and a rectifier circuit 16. The latter circuit generates a supply voltage between the leads 15 and 17, which supply voltage is applied to a storage circuit 18. This circuit comprises control circuits and a memory and the data contained therein is output, for example, serially, via the lead 19 for supply to the load device 20. The two values of binary data are represented, for example, by different signal durations or signal phases during which the load device 20 forms an increased load between the leads 11 and 13. The resultant, different loading of the coil 14 acts on the coil 12 via the magnetic alternating field and can be detected in the read station 10.

When the electromagnetic coupling between the coils 12 and 14 is only weak, for example, due to a large distance in space, a changed load of the coil 14 has only little effect on the coil 12, so that it is difficult to detect the transmitted data in the read station 10. However, the load device 20 must at least substantially increase the load of the coil 14 which is already present due to the rectifier 16. However, the alternating voltage generated by the coil on the leads 11 and 13 also breaks down substantially, so that the rectifier circuit 16 can generate only a small supply voltage on the outputs 15 and 17. This supply voltage may be inadequate for reliable operation of the storage circuit.

It is to be noted that the storage circuit 18 may be integrated, together with the rectifier circuit 16 and the load device 20, in a single semiconductor element.

Figure 2:
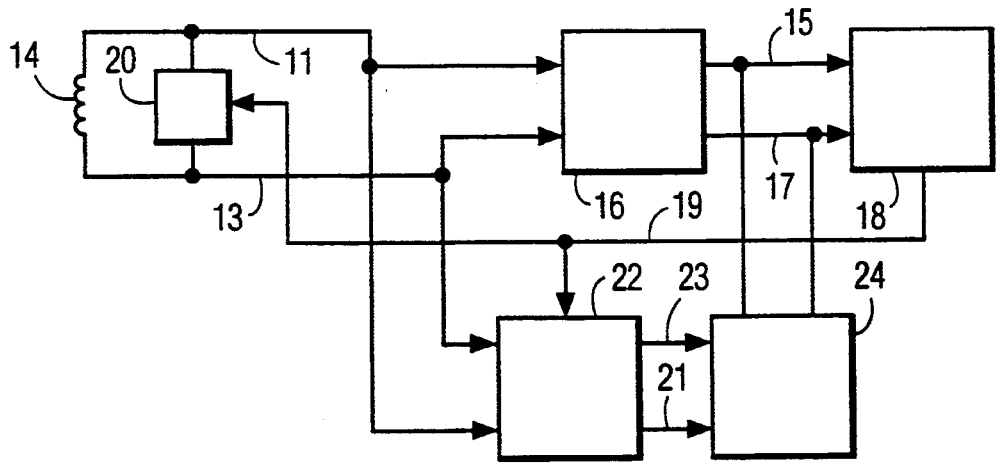
FIG. 2 shows a block diagram of a device in accordance with the invention.

FIG. 2 shows a circuit arrangement in accordance with the invention which allows for a substantially greater variation of the coil load. Therein, elements corresponding to the elements of the circuit arrangement of FIG. 1 are denoted by corresponding references.

Via the leads 11 and 13, a voltage increase circuit is additionally connected to the coil 14, which voltage increase circuit consists of a switching device 22 and a voltage multiplier circuit 24. The switching device 22 is also controlled by the data from the storage circuit 18 via the lead 19. In dependence on this data, a switching output 21 or 23 is coupled to the associated input lead 11 or 13, respectively, so that the voltage generated by the coil 14 is applied to the voltage multiplier circuit 24 substantially unchanged. The direct voltage generated by the latter circuit is applied to the supply voltage leads 15 and 17, it being assumed that the rectifier circuit 16 is blocked when the supply voltage on the leads 15 and 17 is higher than the direct voltage generated by the rectifier circuit.

Figure 3:
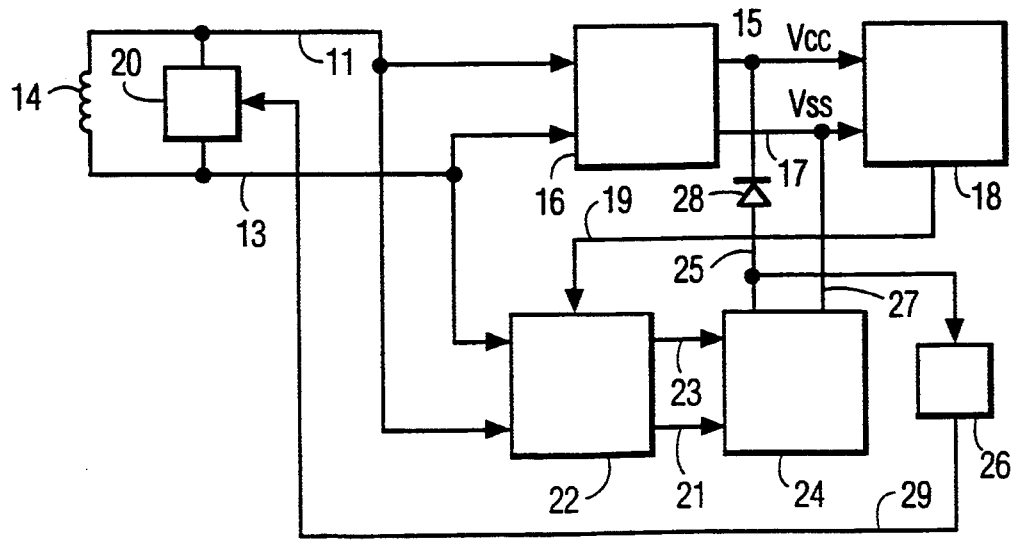
FIG. 3 shows a further version of the device shown in FIG. 2.

FIG. 3 shows a circuit arrangement whose operating reliability is higher. A voltage increase circuit, consisting of the switching device 22 and the voltage multiplier 24, is again connected to the coil 14, via the leads 11 and 13, parallel to the load device 20 and the rectifier circuit 16. The output voltage generated by the voltage multiplier 24, however, is now applied, via a rectifier 28, to the lead 15 for one pole VCC of the supply voltage, whereas the lead 17 for the other pole VSS of the supply voltage is connected directly to the output 27 of the circuit 24. The output 25 of the circuit 24 is connected directly to a voltage comparator circuit 26 which generates a control signal on an output lead 29 when the voltage on the output 25 exceeds a predetermined reference voltage. The data output by the storage circuit 18 via the lead 19 controls only the switching device 22 in FIG. 3, whereas the load device 20 is controlled only by the control signal on the lead 29.

The function of the circuit arrangement shown in FIG. 3 is as follows. During the phase of the data signal on the lead 19 during which the load device 20 is not to be switched on, the rectifier circuit 16 generates the supply voltage on the leads 15 and 17, whereas the switching device 22 isolates the switching outputs 21 and 23 from the corresponding inputs so that the voltage multiplier circuit 24, and hence also the voltage comparator circuit 26, does not generate an output signal.

When the switching device 22 is switched on because of a data signal on the lead 19, thus connecting the switching outputs 21 and 23 to the input leads 11 and 13, respectively, the voltage multiplier circuit 24 builds up a voltage on the output 25 which ultimately exceeds the reference voltage in the voltage comparator 26, so that the latter generates a control signal on the lead 29 which switches on the load device 20.

The alternating voltage on the leads 11 and 13 thus decreases so that the rectifier circuit 16 can no longer deliver an adequate supply voltage, the supply of the supply voltage then being taken over by the voltage multiplier circuit 24 via the rectifier 28. It will be evident that in the voltage comparator 26 the reference voltage must be chosen to be so high that the voltage comparator is activated only when the voltage multiplier circuit 24 has built up an adequate supply voltage for the storage circuit 18.

In this manner at the same time the load is controlled by the load device 20, it being assumed that the magnitude of the load can be controlled by an analog signal on the lead 29. This is because when the load is so high that also the voltage multiplier circuit 24 can no longer generate an adequate supply voltage on the output 25, the signal generated on the lead 29 by the voltage comparator 26 decreases and the loading by the load device 20 also decreases. This control circuit thus automatically maintains the voltage on the output 25 at the reference value predetermined in the voltage comparator 26 and hence at a value which is sufficiently high to ensure reliable operation of the storage circuit 18.

Figure 4:
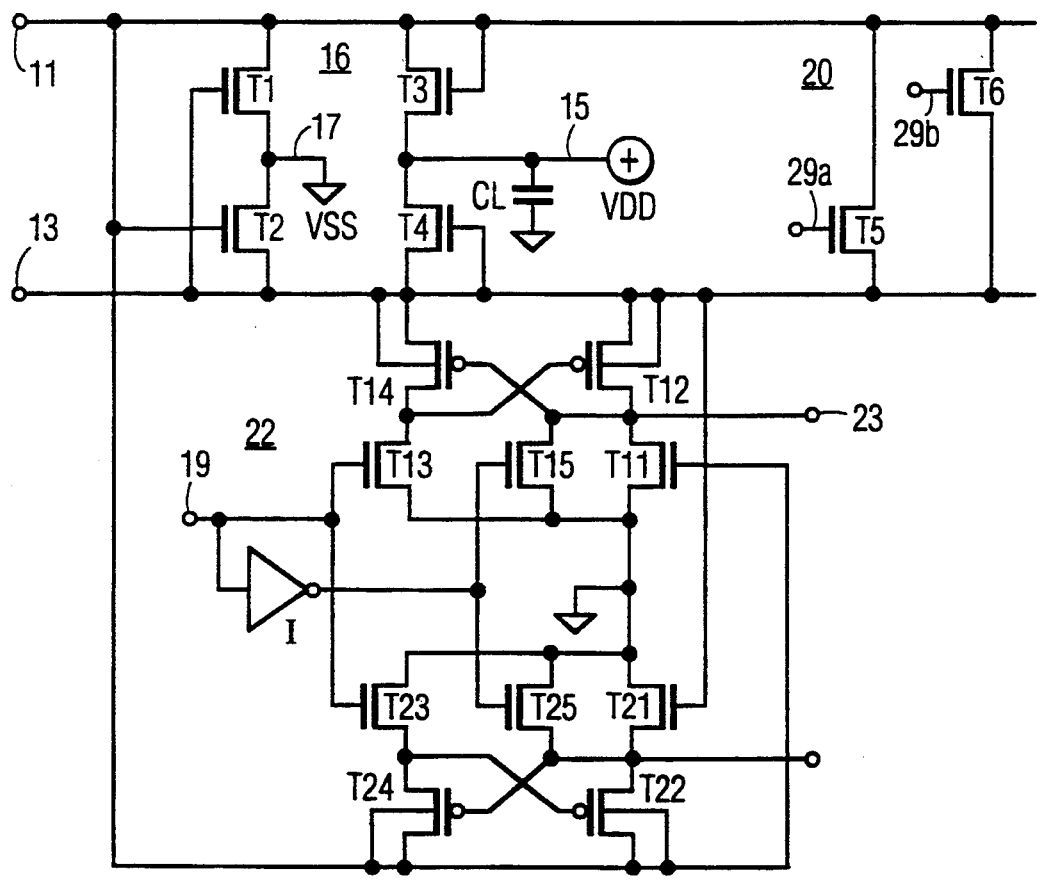
FIG. 4 shows a rectifier circuit and a circuit arrangement for the voltage increase circuit.

FIG. 4 shows a feasible construction of the rectifier 16, the load device 20 and the switching device 22. These devices consist exclusively of field effect transistors, denoted by the abbreviation FET.

The rectifier circuit 16 comprises the FETs T1 to T4 which form two branches. In the first branch the FETs T1 and T2 connect the leads 11 and 13, respectively, which leads are connected to the coil 14 in the FIGS. 1 to 3, terminal 17 for one pole VSS of the direct voltage to be generated. The gate of each of the FETs T1 and T2 is connected to the respective other lead 13, 11, respectively. When the voltage on the lead 11 is more positive than that on the lead 13, the FET T2 is turned on and couples the lead 13 to the terminal 17. Similarly, when the lead 13 is more positive than the lead 11, the FET T1 is turned on to couple the lead 12 to the terminal 27. Thus, substantially no voltage drop occurs between the terminal 17 and the relevant lead coupled thereto.

In the other branch the FETs T3 and T4 are connected between one of the leads 11 and 13, respectively, and the output terminal 15 for the positive pole VDD of the direct voltage to be generated. The gates of the FETs T3 and T4 are connected to the respective same leads 11 and 13. The terminal 15 for the direct voltage is also connected to a capacitance CL, the other terminal of which is connected to the other pole VSS of the direct voltage which is represented here and also at other points throughout the circuit by a triangle. The capacitance CL generates a smoothed direct voltage. Whenever the voltage on the lead 11 or 13 becomes more positive than the smoothed direct voltage by an amount equal to the threshold voltage of the FETs T3 and T4, respectively, the relevant FET is turned on and charges the capacitance CL. The rectifier circuit 16 thus generates a direct voltage which is an amount equal to the threshold voltage of the FETs lower than the maximum amplitude of the voltage between the leads 11 and 13. However, this is not a drawback because the rectifier circuit 16 operates only in the deactivated state of the load device 20, in which state a sufficiently high alternating voltage is already present between the leads 11 and 13.

The switching device 22 serves to couple the outputs 21 and 23 to the leads 11 and 13, respectively, when it is activated via a corresponding data signal on the input 19, and to connect the outputs permanently to the negative pole of the direct voltage in its deactivated state.

The FETs T11 and T21 are connected between the outputs 23, 21 and the negative pole of the direct voltage, and the gates are connected, like those of the FETs T1 and T2, to the respective other lead 11 and 13, respectively. Via this connection and the corresponding FETs T1 and T2 of the rectifier circuit 16, the output terminals 21 and 23 are coupled to the relevant leads 11 and 13, respectively, when the voltage on this lead is lower than that on the respective other lead. This is independent of the signal on the input 19.

In order to connect one of the outputs 21 or 23 to a lead 11 or 13 carrying a positive voltage, there are provided the FETs T12 and T22, respectively. When the input 19 receives a positive voltage, the FETs T13 and T23 are turned on so that the p-channel FETs T12 and T22 are also turned on as soon as the voltage on the relevant lead 11 or 13 is more positive relative to the negative pole of the direct voltage by an amount equal to the FET threshold voltage. The relevant outputs 21 and 23 then are coupled to the associated leads 11 and 13, respectively, without a voltage drop. As a result, the voltage multiplier connected to the outputs 21 and 23 can operate with the maximum available voltage.

In the case of a high signal on the input 19, however, the FETs T15 and T25 are turned off via the inverter I, and the p-channel FETs T14 and T24 are also turned off via the turned-on FETs T12 and T22.

In the case of a low signal on the input 19, the FETs T13 and T23 are turned off and the FETs T15 and T25 are turned on via the inverter I so that the outputs 21 and 23 are continuously coupled to the negative pole of the direct voltage. Moreover, the FETs T14 and T24 are turned on so that the FETs T12 and T22 are continuously turned off. This state of the switching device 22 is referred to as the switched-off state.

The load device 20 consists of the two FETs T5 and T6 which are connected parallel to the leads 11 and 13. The gates of these FETs are connected to inputs 29a and 29b which are driven by voltage comparators as will be described hereinafter.

Figure 5:
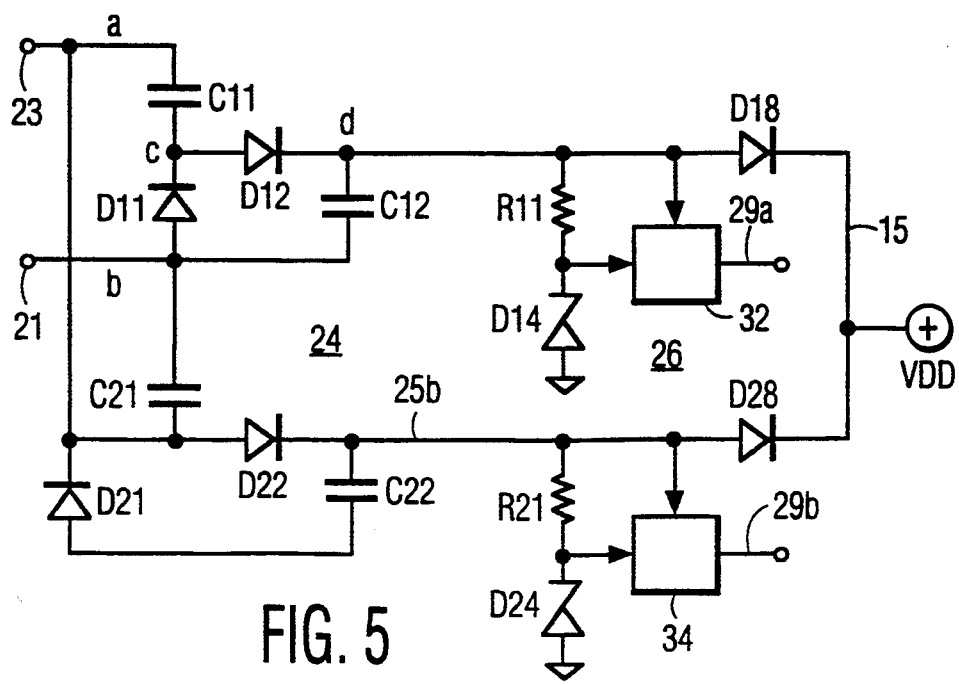
FIG. 5 shows the principle of a voltage multiplier circuit.

FIG. 5 shows a construction of the voltage multiplier 24 of FIG. 3 in detail, the voltage comparator 26 also being shown in greater detail. The voltage multiplier 24 consists of two sections which have an identical construction but are connected to the switching inputs 21 and 23 in a reversed manner so that the two sections operate with an offset amounting to one half phase of the pulse-like periodic input voltages on the switching inputs 21 and 23. For the sake of simplicity, the function of only one section of the voltage multiplier 24 will be described in detail hereinafter with reference to FIG. 6 which shows the variation in time of the voltages at the four points a, b, c and d in the circuit shown in FIG. 5. For further simplification it is assumed that the voltages at the points a and b, i.e. the switching inputs 21 and 23, fluctuate in phase opposition between 0V and U in a squarewave fashion.

When the point b carries the voltage U in the first phase considered, the capacitance C11 is charged via the diode D11, i.e. the point c receives the voltage U and, via the diode D12, the point d also receives the voltage U. When the point a carries the voltage U during the next phase, the point c receives a voltage 2U and hence the capacitance C12 at the point d is also charged to the voltage 2U via the diode D12. Voltage drops across the diodes D11 and D12 as well as voltage losses across the capacitances due to changes of charge are ignored for the sake of simplicity.

In the next phase, the point b carriesthe voltage U again and the point a carries 0V, so that the point c is again charged to U, but the point d receives a voltage 3U. In the next phase, in which the point b again carries 0V, the point d again receives 2U and is recharged again by the capacitance C11, via the diode D12. The voltage on the lead 25a thus fluctuates periodically between 2U and 3U. This is aim the case on the lead 25b, be it shifted through one phase, so that the voltage 3U is continuously present, via the diodes D18 and D28, on the lead 15 for the positive supply voltage VDD, notably when the charging capacitance CL connected to the lead 15 in FIG. 4 is taken into account. The diodes D 18 and D28 correspond to the rectifier 28 of FIG. 3.

Because of the periodically fluctuating voltage on the leads 25a and 25b, the voltage comparator 26 also consists of two sections: R11, D14 and the block 32 as well as R21, D24 and the block 34, the construction of said sections being identical. Via the resistance R11 and the zener diode D14, a reference voltage is generated and the block 32 outputs a signal on the output 29a when a predetermined relation exists between the voltage on the lead 25a and the reference voltage, for example, when it is higher by a predetermined factor or a predetermined absolute amount. A periodic signal is thus generated on the output 29a. The same holds for the output 29b of the block 34 where this signal, however, has been shifted one phase relative to the signal on the output 29a.

The outputs 29a and 29b in FIG. 5 are connected to the gates of the FETs T5 and T6 in FIG. 4 so that always one of these two transistors is turned on when the switching device 22 is activated and the voltage multiplier 24 generates a higher voltage. Under the control of the load device by the FETs T5 and T6, via the voltage comparator 26, the voltage between the leads 11 and 13 is controlled to a value which is always equal to one third of the voltage at which the voltage comparator 26 is activated, so that the direct voltage VDD on the lead 15 for feeding the other circuits (not shown) always has a predetermined minimum value.

The voltage loss across the capacitances C11, C12, C21 and C22, actually occurring in practice due to change of charge, can be minimized in the steady state when the values of the capacitances are sufficiently high, taking into account the frequency of the input voltage and the loading by the remainder of the circuit. The voltage drop across the diodes D11, D12 and D18 as well as D21, D22 and D28, however, can remain small when these diodes are realised as shown in detail in FIG. 7. This Figure shows only one part of the voltage multiplier 24 and the voltage comparator 26 because the other part is of the same construction. The diode D11 of FIG. 5 is formed essentially by a FET T31 whose gate is connected to a bias circuit which supplies the gate with a bias voltage approximately equal to the threshold voltage of the FET T31, so that this transistor is already turned on when the voltage on the switching input 21 is only slightly higher than the voltage across the capacitor C11.

The bias circuit comprises a capacitance C33 which keeps the bias voltage on the gate of the FET T31 substantially constant relative to the terminal connected to the input 21 and which is periodically charged via the FET T34 as follows. When the voltage at the input 21 is positive relative to the voltage at the input 23, the capacitance C32 is charged via the FET T35. When subsequently, the voltage at the input 23 is positive relative to the voltage at the input 21 during the next phase, charge is transferred from the capacitance C32 to the capacitance C33 via the FET T34. When the voltage across the capacitance C33 then exceeds the threshold voltage of the FET T36, being equal to the threshold voltage of the FET T31, the FET T31 is turned on and hence limits the voltage across the capacitance C33, and hence the voltage at the gate of the FET T31, to the threshold voltage. In this manner in FIG. 5 a diode D11 is realised which exhibits substantially no voltage drop. Similarly, the diode D12 is realised by way of a FET T32 which is connected to a bias circuit of the same construction and operation as the bias circuit of the FET T31. Thus, on the lead 25a a voltage appears which, except for small load losses of the capacitances C11 and C12, is as nearly as possible equal to three times the amplitude of the voltage between the inputs 21 and 23. Via the FET T33, also comprising a bias circuit of the described construction, this voltage is applied to the lead 15 for the positive supply voltage which, therefore, is also substantially equal to three times the switching voltage between the inputs 21 and 23.

Furthermore, the voltage on the lead 25 is applied, via the resistance R11, to a chain of FETs T43 . . . T44, corresponding to the zener diode D14 with a zener voltage equal to the chain of threshold voltages of the FETs T43 to T44. The junction point of the resistance R11 and the chain of FETs is connected to the gate of a p-channel FET T41, one main terminal of which is also connected to the lead 25a. When the voltage on the lead 25a is so high that a voltage drop equal to the threshold voltage of the FET T41 occurs across the resistance R11 due to the current through the FETs T43 to T44, the FET T41 is turned on so that the output 29a receives a positive voltage and the FET T5 of the load device 20 of FIG. 4 connected thereto is turned on. The FET T42, whose gate is connected to the supply voltage, then serves merely as a working resistance.

I claim:

1. A device for contactless energy and data transmission, comprising: a storage circuit having an output lead for the output of stored data, a coil for receiving a magnetic alternating field and for generating an alternating voltage, a circuit arrangement for generating a supply voltage for the storage circuit, the circuit arrangement comprising a rectifier circuit which is connected to the coil in order to generate the supply voltage from the alternating voltage, and a load device for generating an increased load of the coil which is dependent on the output data on the output lead, wherein, parallel to the rectifier circuit a voltage increase circuit is connected to the coil, which voltage increase circuit comprises a control input which is connected to the output lead of the storage circuit and serves to generate a direct voltage which is higher relative to the amplitude of the alternating voltage on a voltage output and which serves as a supply voltage for the storage circuit for the duration of the increased load.

2. A device as claimed in claim 1, wherein the voltage output of the voltage increase circuit is connected to a supply voltage input of the storage circuit via a rectifier device and directly to a voltage comparator circuit which outputs a control signal to the load device when the higher direct voltage reaches a predetermined value, the load device increasing the load of the coil only under the control of said control signal.

3. A device as claimed in claim 2, wherein the voltage increase circuit comprises a voltage multiplier circuit and a switching device which includes a control input connected to the storage circuit output lead in order to receive the output data, two inputs which are connected to the coil, and two switching outputs which are connected to the voltage multiplier circuit and which are coupled to an associated input of the voltage multiplier circuit dependent upon the data received at the control input.

4. A device as claimed in claim 1 wherein the voltage increase circuit comprises a voltage multiplier circuit and a switching device which includes a control input connected to the output lead in order to receive the output data, two inputs which are connected to the coil, and two switching outputs which are connected to the voltage multiplier circuit and which are coupled to an associated input thereof dependent upon on the data received at the control input.

5. A device as claimed in claim 3, comprising at least one voltage multiplier circuit including capacitances and rectifier devices, wherein each rectifier device is formed by the main current path of a first field effect transistor whose gate is connected to a bias circuit in order to supply a bias voltage for the gate relative to a terminal of the main current path, thus reducing the effective threshold voltage of the field effect transistor in the turn-on state, the bias circuit comprising capacitances and rectifier devices in the form of further field effect transistors.

6. A device as claimed in claim 1 further comprising;
a comparator which compares the voltage output of the voltage increase circuit with a reference voltage and which supplies a control signal to control the load device so as to maintain a given minimum voltage across the coil.

7. A device as claimed in claim 6 wherein;
said given minimum coil voltage is operative as the input voltage to the voltage increase circuit whereby the output voltage thereof is maintained at a predetermined minimum voltage level.

8. A device as claimed in claim 1 further comprising;
a circuit for receiving and evaluating the stored data output and which includes a second coil magnetically coupled to the first coil.

9. A data transmission apparatus comprising:
a data storage circuit having an output for the stored data,
coil means for receiving an alternating magnetic field and for generating an alternating voltage,
a rectifier circuit having an input coupled to said coil means and an output for coupling a DC supply voltage to an input of the data storage circuit,
a variable load coupled across the coil means and with the load being variable as a function of the output data at the output of the data storage circuit, and
a voltage increase circuit having its input coupled to the coil means and its output coupled to said input of the data storage circuit, wherein said voltage increase circuit includes a control input coupled to said output of the data storage circuit whereby the voltage increase circuit derives a DC supply voltage at its output which is determined by the output data at the output of the data storage circuit, said voltage increase circuit being responsive to said output data to provide the DC supply voltage at the input of the data storage circuit when the variable load is at a high value and wherein said rectifier circuit provides the DC supply voltage at the input of the data storage circuit when the load is at a low value.

10. A data transmission apparatus as claimed in claim 9 wherein;
said variable load has a control input for adjusting the load level, and
means for coupling said control input of the variable load to said data output of the data storage circuit.

11. A data transmission apparatus as claimed in claim 10 wherein;
said voltage increase circuit comprises a switching device coupled to said coil means and having a control input coupled to said data output of the data storage circuit for controlling the operation of the switching device as a function of the data output.

12. A data transmission apparatus as claimed in claim 9 wherein;
said voltage increase circuit comprises a switching device coupled to said coil means and having a control input coupled to said data output of the data storage circuit for controlling the operation of the switching device as a function of the data output.

13. A data transmission apparatus as claimed in claim 12 wherein;
said voltage increase circuit further comprises a voltage multiplier circuit coupled in cascade with the switching device and having an output which comprises the output of the voltage increase circuit, and said control input of the switching device is the control input of the voltage increase circuit.

14. A data transmission apparatus as claimed in claim 9 further comprising;
a rectifier device coupling the output of the voltage increase circuit to the input of the data storage circuit, and
said voltage increase circuit comprises a switching device coupled to said coil means and having a control input coupled to said data output of the data storage circuit for controlling the operation of the switching device as a function of the data output, said switching device being operative to effectively decouple the voltage increase circuit from the data storage circuit when the output data calls for said low load value.

15. A data transmission apparatus as claimed in claim 14 further comprising;
a voltage comparator circuit having a first input directly connected to the output of the voltage increase circuit and a second input coupled to a source of reference voltage so that an output of the voltage comparator circuit supplies a control signal to a control input of the variable load when the output voltage of the voltage increase circuit reaches a predetermined voltage level.

16. A data transmission apparatus as claimed in claim 9 further comprising;
a rectifier device coupling the output of the voltage increase circuit to the input of the data storage circuit, and
a voltage comparator circuit having a first input directly connected to the output of the voltage increase circuit and a second input coupled to a source of reference voltage so that an output of the voltage comparator circuit supplies a control signal to a control input of the variable load when the output voltage of the voltage increase circuit reaches a predetermined voltage level.

17. A data transmission apparatus as claimed in claim 9 further comprising;

a comparator which compares the voltage output of the voltage increase circuit with a reference voltage and which supplies a control signal to control the variable load so as to maintain a given minimum voltage across the coil means.

18. A data transmission apparatus as claimed in claim 17 wherein;

said given minimum coil voltage is operative as the input voltage to the voltage increase circuit whereby the output voltage thereof is maintained at a predetermined minimum voltage level.

* * * * *

UNITED STATES PATENT AND TRADEMARK OFFICE
CERTIFICATE OF CORRECTION

PATENT NO.   :   5,394,105
DATED        :   Feb. 28, 1995
INVENTOR(S)  :   Klaus Axer It is certified that error appears in the above-indentified patent and that said Letters Patent is hereby corrected as shown below:

Item [57] Abstract
line  7, after "However" insert --,-- (comma);
line 10, after "energize" insert --the storage circuit--.

Column 5, line 31, change "12" to --11--;
         line 32, change "27" to --17--;
Column 8, line 18, change "25" to --25a--.

IN THE CLAIMS
Col. 9, claim 4, line 8, delete "on".
Col. 9, claim 5, line 1, change "3" to --4--
         line 4, change "the" to --a--.

Signed and Sealed this

Tenth Day of October, 1995

Attest:

BRUCE LEHMAN

Attesting Officer

Commissioner of Patents and Trademarks